(12) United States Patent
Singh et al.

(10) Patent No.: US 9,324,827 B1
(45) Date of Patent: Apr. 26, 2016

(54) NON-PLANAR SCHOTTKY DIODE AND METHOD OF FABRICATION

(71) Applicant: GLOBALFOUNDRIES Inc., Grand Cayman (KY)

(72) Inventors: Jagar Singh, Clifton Park, NY (US); Jerome Ciavatti, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/525,744

(22) Filed: Oct. 28, 2014

(51) Int. Cl.
*H01L 29/66* (2006.01)
*H01L 29/872* (2006.01)
*H01L 29/06* (2006.01)

(52) U.S. Cl.
CPC ...... *H01L 29/66143* (2013.01); *H01L 29/0657* (2013.01); *H01L 29/872* (2013.01)

(58) Field of Classification Search
CPC .............. H01L 2924/00; H01L 29/872; H01L 2924/0002; H01L 29/0619; H01L 29/66143; H01L 23/585; H01L 27/0629; H01L 27/0814; H01L 23/564; H01L 23/562
See application file for complete search history.

(56) References Cited

U.S. PATENT DOCUMENTS

| 6,426,541 | B2 * | 7/2002 | Chang et al. | 257/472 |
| 7,939,905 | B2 * | 5/2011 | Nagai | 257/479 |
| 8,018,021 | B2 * | 9/2011 | Kim et al. | 257/476 |
| 2008/0211020 | A1 * | 9/2008 | Saito | 257/342 |
| 2009/0294865 | A1 * | 12/2009 | Tang et al. | 257/369 |
| 2013/0062723 | A1 * | 3/2013 | Henning et al. | 257/484 |

* cited by examiner

*Primary Examiner* — Michelle Mandala
(74) *Attorney, Agent, or Firm* — Wayne F. Reinke, Esq.; Heslin Rothenberg Farley & Mesiti P.C.

(57) ABSTRACT

A non-planar Schottky diode includes a semiconductor substrate of a first type, the first type including one of n-type and p-type. The structure further includes raised semiconductor structure(s) of a second type opposite the first type coupled to the substrate, isolation material surrounding a lower portion of the raised structure(s), a first well of the second type directly under the raised structure(s), a guard ring of the first type around an edge of a top portion of the first well, a conformal layer of silicide over a top portion of the raised structure(s) above the isolation material, and a common contact above the conformal layer of silicide. The non-planar Schottky diode can be fabricated with non-planar transistors, e.g., FinFETs.

15 Claims, 5 Drawing Sheets

NON-PLANAR SCHOTTKY DIODE AND METHOD OF FABRICATION

BACKGROUND OF THE INVENTION

1. Technical Field

The present invention generally relates to non-planar Schottky diodes and the fabrication thereof. More particularly, the present invention relates to non-planar Schottky diodes with a common contact for multiple raised structures and the fabrication thereof.

2. Background Information

Planar Schottky diodes have been used with radio frequency (RF) and analog applications, having a fast switching speed and low turn-on voltage compared to p-n junction diodes. However, non-planar Schottky diodes have been challenging to cost-effectively fabricate. With device size continuing to shrink, the industry continues to move toward non-planar semiconductor devices.

Therefore, a need exists for a cost-effective way to fabricate non-planar Schottky diodes.

SUMMARY OF THE INVENTION

The shortcomings of the prior art are overcome and additional advantages are provided through the provision, in one aspect, of a method of fabricating a non-planar semiconductor structure. The method includes providing a starting non-planar semiconductor structure, the structure including a bulk semiconductor substrate of a first type and a plurality of fins etched from the bulk semiconductor substrate with bottom portions thereof surrounded by isolation material over the substrate. The method further includes creating at least one first well of a second type opposite the first type directly under at least two of the plurality of fins, creating the at least one first well also making the one or more groups of at least two fins the second type, and removing a top portion of the isolation material, exposing a top portion of the plurality of fins. The method further includes creating a conformal layer of silicide on the exposed portion of the plurality of fins, and creating one or more contacts common to each group of at least two fins over the conformal layer of silicide, the at least one group of at least two fins includes a Schottky diode and at least one other group of at least two fins includes a FinFET.

In accordance with another aspect, a non-planar semiconductor structure is provided. The structure includes a bulk semiconductor substrate of a first type, the first type including one of n-type and p-type. The structure further includes a plurality of fins of a second type opposite the first type etched from the bulk semiconductor substrate, with isolation material surrounding a lower portion of the fins over the substrate, at least one first well of the second type directly under one or more groups of the at least two of the plurality of fins, a guard ring of the first type around an edge of a top portion of each of the at least one first well, a conformal layer of silicide over a top portion of the plurality of fins above the isolation material, and one or more contacts common to each group of at least two fins above the conformal layer of silicide, at least one group of at least two fins being part of a non-planar Schottky diode, and at least one other group of at least two fins comprises a FinFET.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

Figure 1:
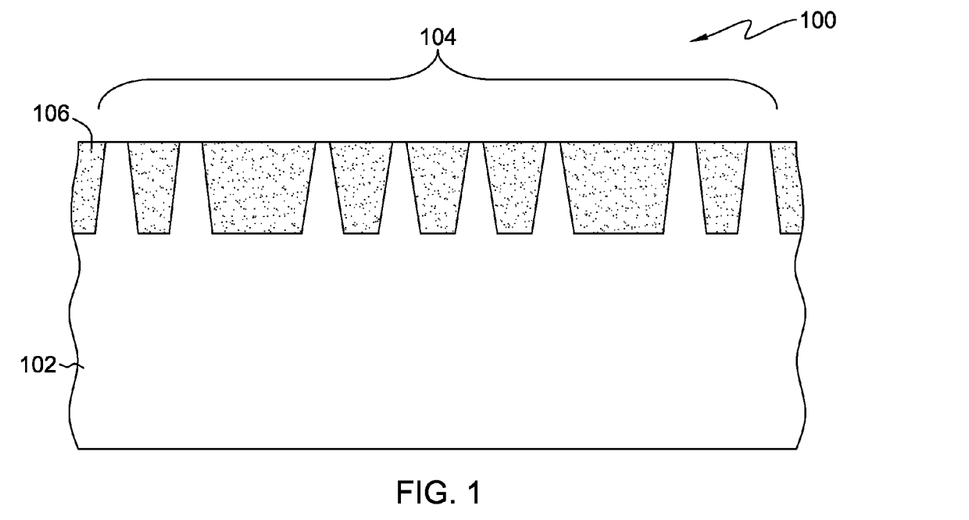
FIG. 1 is a cross-sectional view of one example of a starting non-planar semiconductor structure, including a semiconductor substrate of a first type (n-type or p-type), raised structure(s) of the first type coupled to the substrate and surrounded by isolation material, in accordance with one or more aspects of the present invention.

FIG. 1 is a cross-sectional view of one example of a starting non-planar semiconductor structure 100, including a semiconductor substrate 102 of a first type (n-type or p-type), one or more raised structure(s) 104 of the first type coupled to the substrate and surrounded by isolation material 106 (e.g., shallow trench isolation material), in accordance with one or more aspects of the present invention. Alternatively, the substrate could be of no type, but include a well of the first type.

The starting structure may be conventionally fabricated, for example, using known processes and techniques. However, it will be understood that the fabrication of the starting structure forms no part of the present invention. Further, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the raised structures may each take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type.

Figure 2:
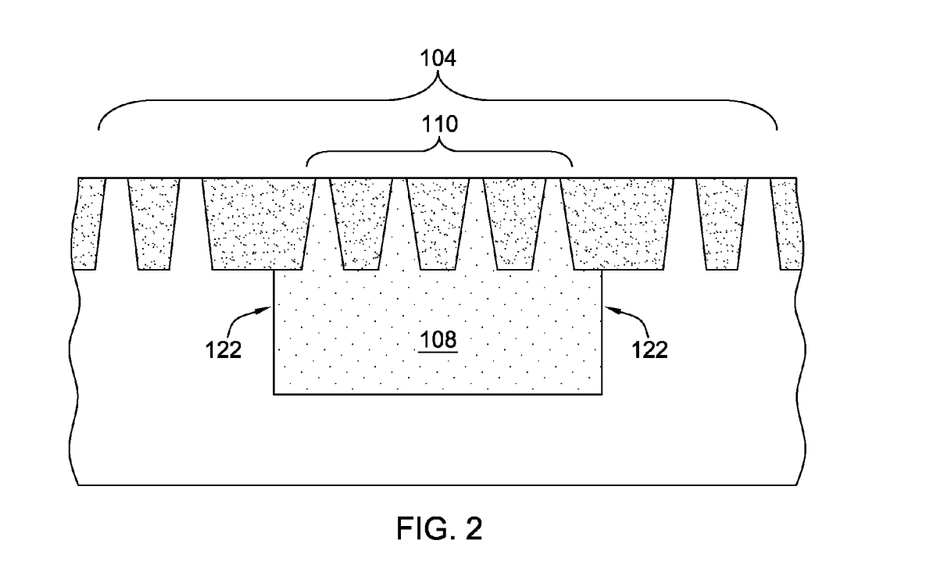
FIG. 2 depicts one example of the starting non-planar semiconductor structure of FIG. 1 after creating a first well of a second type opposite the first type directly under at least two of the raised structures, the group of raised structures also being made of the second type by creating the first well, in accordance with one or more aspects of the present invention.

FIG. 2 depicts one example of the starting non-planar semiconductor structure 100 of FIG. 1 after creating a first well 108 of a second type opposite the first type directly under a group 110 of one or more of the raised structures 104, the group of raised structures also being made of the second type by creating the first well, in accordance with one or more aspects of the present invention. The first well 108 may be created, for example, by implantation through the group of raised structures.

Figure 3:
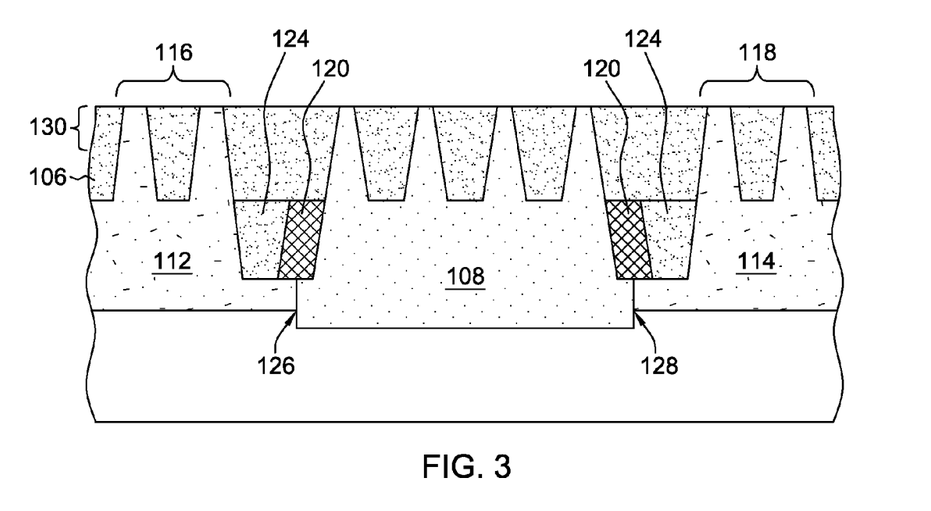
FIG. 3 depicts one example of the non-planar structure of FIG. 2 after creating second well(s) of the second type directly under other raised structure(s) other than the group of raised structures, the second well(s) being adjacent the first well, the creation of the second well(s) also making the other raised structure(s) of the second type, creating a guard ring of the first type at an edge of a top portion of the first well, and isolation material separating the guard ring from the second well(s), the first well and second well(s) being in contact at a bottom of the first well and second well(s) below the guard ring and isolation material, in accordance with one or more aspects of the present invention.

FIG. 3 depicts one example of the non-planar structure of FIG. 2 after creating one or more second well(s) (here, two wells 112 and 114) of the second type directly under other raised structure(s) 116 and 118, respectively, other than the group of raised structures, the second well(s) being adjacent the first well 108, the creation of the second well(s) also making the other raised structure(s) of the second type, creating a guard ring 120 of the first type at opposite edges (122, FIG. 2) of a top portion of the first well, and isolation material 124 separating the guard ring from the second well(s), the first well and second well(s) being in contact at a bottom (126 and 128, respectively) of the first well and second well(s) below the guard ring and isolation material, in accordance with one or more aspects of the present invention.

The second well(s) 112 and 114 may be created by, for example, implantation through the corresponding raised structure(s) 116 and 118, and are preferably of a higher dose of impurities of the second type as compared to the first well 108. Prior to creation of guard ring 120 and isolation material 124, the area that will be occupied by the isolation material is first etched to open the same using, for example, conventional processes and techniques, and then the isolation material surrounding the raised structures may be planarized using, for example, a CMP (chemical-mechanical polishing) process or a dry etch. Creation of the guard ring may be accomplished by, for example, implantation with a higher energy to penetrate the isolation material, and is preferably higher dose impurities of the first type as compared to the substrate (or well of first type in substrate of no type). As one skilled in the art will know, any diffusion region may become rounded off after thermal treatment. Accordingly, it will be understood that the diffusion regions herein are idealized in shape.

Figure 4:
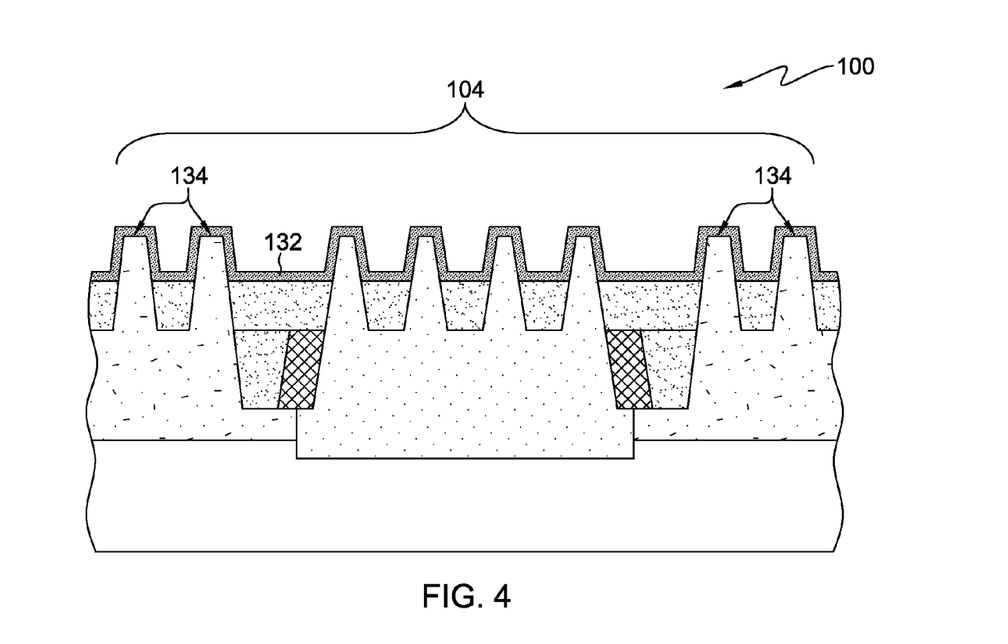
FIG. 4 depicts one example of the non-planar structure of FIG. 3 after recessing a top portion of the isolation material surrounding the raised structures, and creating a blanket conformal layer of a hard mask material over the structure, in accordance with one or more aspects of the present invention.

FIG. 4 depicts one example of the non-planar structure of FIG. 3 after recessing a top portion (130, FIG. 3) of the isolation material surrounding the raised structures 104, and creating a blanket conformal layer 132 of a hard mask material over the structure 100, in accordance with one or more aspects of the present invention.

Recessing the isolation material 106 may be accomplished, for example, using conventional processes and techniques. Creation of the blanket conformal layer 132 of hard mask material (e.g., silicon nitride) may also be accomplished, for example, using conventional processes and techniques.

Figure 5:
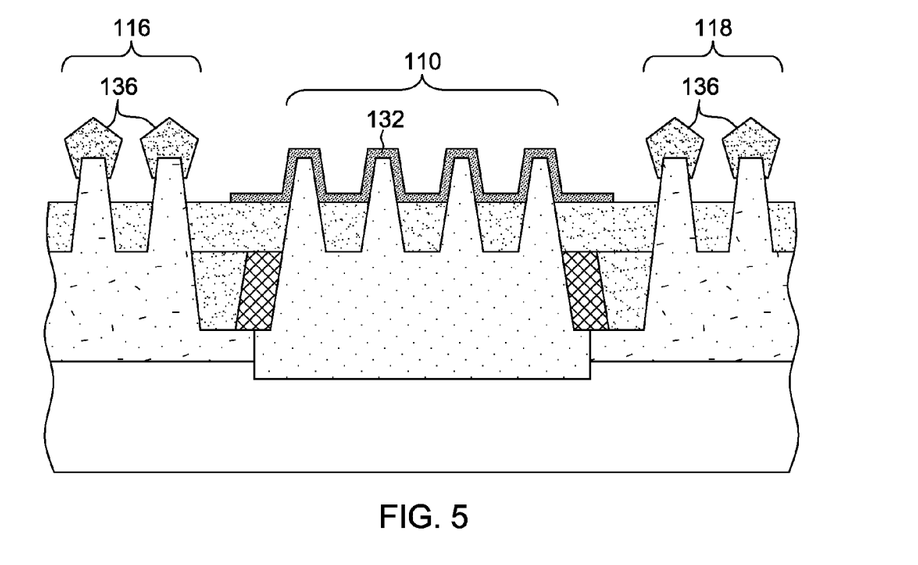
FIG. 5 depicts one example of the non-planar of structure of FIG. 4 after removal of the conformal layer of hard mask material over any raised structure(s) outside the group and recessing a top surface thereof, and creating epitaxial material of the second type on the recessed top surface, in accordance with one or more aspects of the present invention.

FIG. 5 depicts one example of the non-planar of structure of FIG. 4 after removal of the conformal layer 132 of hard mask material over any raised structure(s) outside the group 110, in this case raised structures 116 and 118, and recessing a top surface (134, FIG. 4) thereof, and creating epitaxial material 136 of the second type on the recessed top surface, in accordance with one or more aspects of the present invention.

Removal of the conformal layer 132 of hard mask material over the non-group raised structure(s) may be accomplished, for example, using conventional processes and techniques (e.g., masking group 110 and etching). Recessing top surface(s) 134 of the non-group raised structure(s) and creating epitaxial material thereon (e.g., by growth) may be accomplished using, for example, conventional processes and techniques. The epitaxial material for n-type second well(s) may be, for example, epitaxial phosphorus-doped silicon, and for p-type second well(s) may be, for example, epitaxial silicon germanium.

Figure 6:
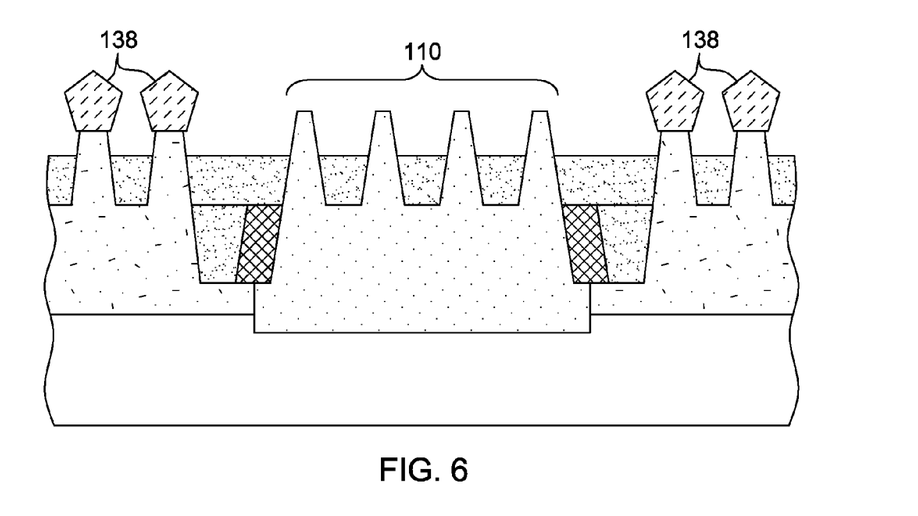
FIG. 6 depicts one example of the non-planar structure of FIG. 5 after adding additional impurities of the second type to the epitaxial material, and removing the hard mask layer over the group of raised structures, in accordance with one or more aspects of the present invention.

FIG. 6 depicts one example of the non-planar structure of FIG. 5 after adding additional impurities 138 (e.g., by implantation) of the second type to the epitaxial material, and removing the hard mask layer (132, FIG. 5) over the group 110 of raised structures, for example, by conventional etch, in accordance with one or more aspects of the present invention.

Figure 7:
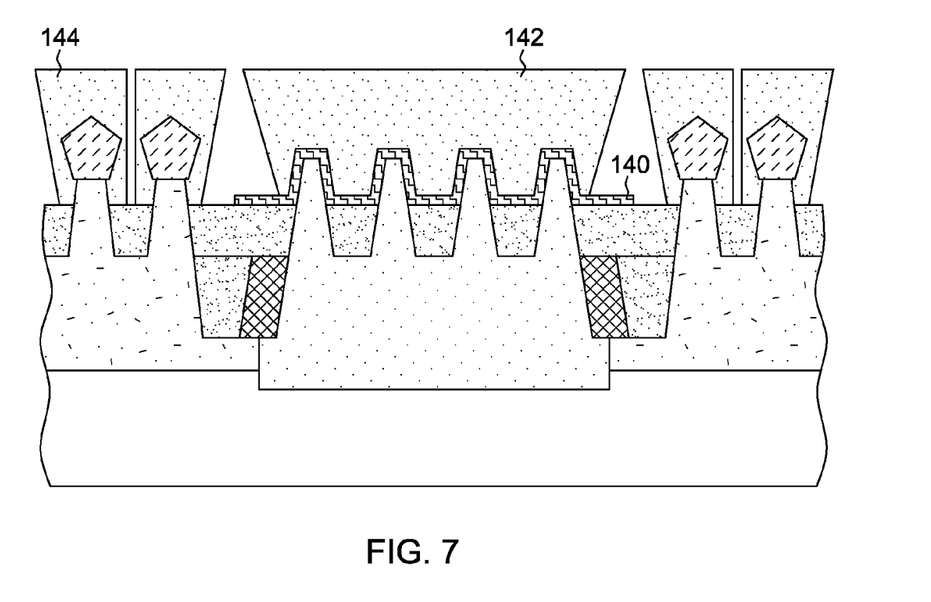
FIG. 7 depicts one example of the non-planar structure of FIG. 6 after creating a conformal layer of silicide over the group of raised structures, creating a common contact for the group of raised structures, and creating a contact for each of any other raised structure(s), in accordance with one or more aspects of the present invention.

FIG. 7 depicts one example of the non-planar structure of FIG. 6 after creating a conformal layer of silicide 140 over the group 110 of raised structures, creating a common contact 142 for the group of raised structures, and creating an individual contact (e.g., contact 144) for each of any non-group raised structure(s), in accordance with one or more aspects of the present invention. Using the process flow for fabrication of non-planar transistors is cost-effective, particularly when co-fabricating non-planar Schottky diodes with non-planar transistors (e.g., FinFETs). Note also, that although only one group having common contact is shown, there could be multiple groups of two or more raised structures, each group having a common contact. In addition, although not preferred, a common contact could be split into smaller common contacts and/or individual contacts.

The silicide (e.g., titanium silicide or other metal silicide) may be created, for example, by masking the non-group raised structures and using conventional processes and techniques to create the silicide. The contacts include conductive material (e.g., tungsten) and may be created using conventional processes and techniques.

Preferably, the common contact occupies a larger area than any given individual contact. In addition, it can be reasonably assumed that a larger contact, all other variables being about the same, will etch faster than a relatively smaller contact, that each size contact will have a desired etch window of etch rate and contact size, and that the etch window for the larger contact will be larger than the etch window for the smaller contact. Also preferably, a common etch rate for all contacts is selected, in order to make fabrication easier and less costly. For example, different etch rates may require, for example, one or more additional masks, as compared to a common etch rate. In one example, a common etch rate for all contacts may be selected that favors the accuracy or landing of the common contact over the individual contacts, while still being within a desired etch window for the individual (smaller) contacts.

Figure 8:
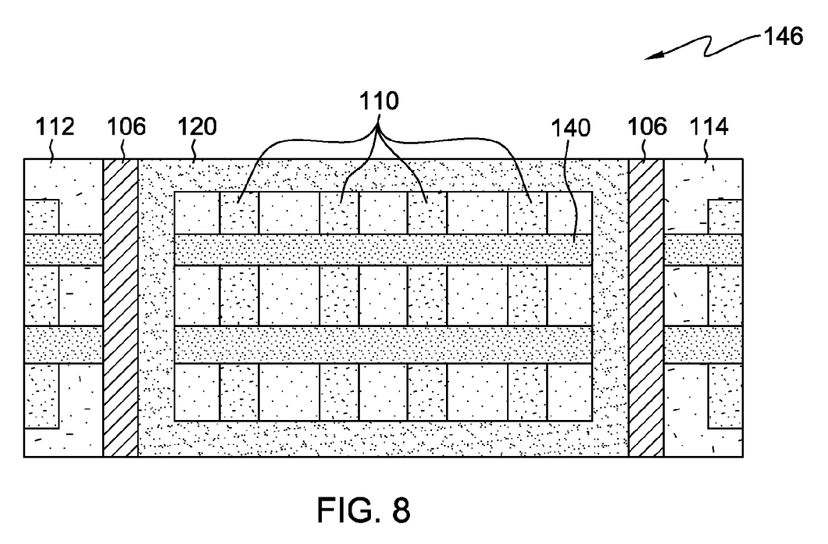
FIG. 8 is a top-down view of one example of the non-planar structure of FIG. 7 after creation of the silicide and before creating the contacts, in accordance with one or more aspects of the present invention.

FIG. 8 is a top-down view of one example of the non-planar structure 146 of FIG. 7 after creation of the silicide and before creating the contacts, in accordance with one or more aspects of the present invention.

Figure 9:
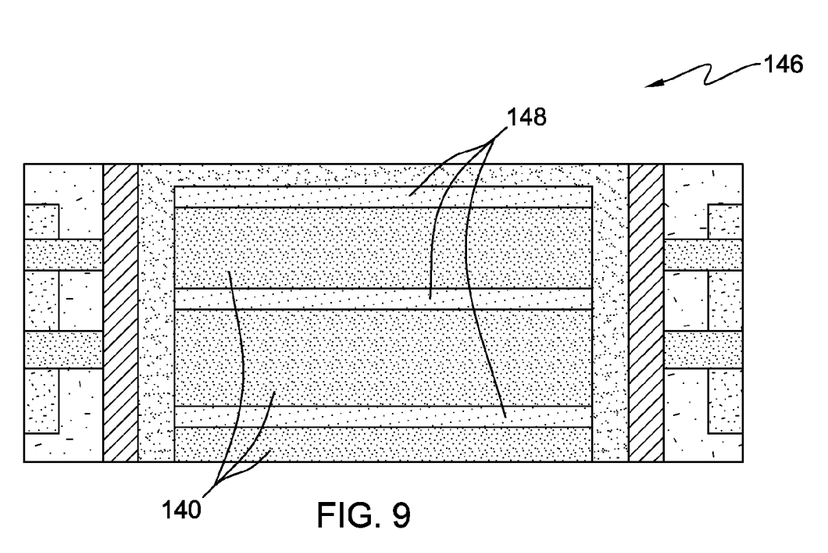
FIG. 9 is an alternate version of one example of the non-planar structure of FIG. 8, showing a larger area of the silicide between areas of dummy gate material, in accordance with one or more aspects of the present invention.

FIG. 9 depicts an alternate version of one example of the non-planar structure 146 of FIG. 8, showing a larger area of the silicide 140 between areas of dummy gate material, in accordance with one or more aspects of the present invention. Inclusion of the dummy gate material makes the non-planar Schottky diode more manufacturable where commonly fabricated with non-planar transistors employing dummy gate material replaced downstream with conductive (final) gate material.

In a first aspect disclosed above is a method of fabricating a non-planar semiconductor structure. The method includes providing a starting non-planar semiconductor structure, the structure including a semiconductor substrate of a first type (n-type or p-type) and multiple raised semiconductor structures coupled to the substrate and surrounded by isolation material. The method further includes creating first well(s) of a second type opposite the first type directly under group(s) of at least two of the multiple raised structures, creating the first well(s) also making the group(s) of raised structures the second type, and removing a top portion of the isolation material, exposing a top portion of the multiple raised semiconductor structures. The method further includes creating a conformal layer of silicide on the exposed portion of the multiple raised structures, and creating contact(s) common to each group of raised structures over the conformal layer of silicide.

In one example, the method of the first aspect may further include, for example, between creating the first well(s) and removing the top portion of the isolation material, creating a guard ring at an edge of a top portion of each first well. In another example, the multiple raised semiconductor structures of the provided non-planar semiconductor structure with guard ring may further include, for example, other raised semiconductor structure(s) coupled to the substrate, and the method may further include, for example, prior to removing the top portion of the isolation material, implanting impurities in and under the other raised structure(s), the implant coming into contact with one or more of the well(s) at a bottom portion thereof below the guard ring. After removing the top portion of the isolation material, the method may further include, for example: creating a conformal layer of hard mask material over the exposed portion of the group(s) of raised structures; after creating the conformal layer of hard mask material, creating epitaxial semiconductor material of the second type on a top portion of the other raised semiconductor structure(s); after creating the epitaxial material and prior to creating the conformal layer of silicide, removing the conformal layer of hard mask material; and creating a contact over the epitaxial semiconductor material for each of the other raised semiconductor structure(s).

In another example, creating the conformal layer of hard mask material may include, for example, creating a blanket conformal layer of hard mask material over the exposed portion of the group(s) of raised semiconductor structures and the other raised semiconductor structure(s), and removing the blanket conformal layer of hard mask material over the other raised semiconductor structure(s).

In another example, where the other raised structure(s) are present, the method may further include, for example, implanting the epitaxial material with additional impurities of the second type.

In still another example, where the other raised structure(s) are present, the method may further include, for example, prior to creating the epitaxial material, recessing a top surface of the other raised structure(s), and creating the epitaxial material may include creating the epitaxial material on the recessed top surface.

In another example, where the other raised structure(s) are present, creating the epitaxial material may include, for example, growing the epitaxial material.

In yet another example, the multiple raised semiconductor structures of the non-planar semiconductor structure of the method of the first aspect may further include, for example, other raised semiconductor structure(s) coupled to the substrate, and the method may further include creating an individual contact over each of the other raised semiconductor structure(s), the common contact having a larger area than each individual contact, and selecting a common etch rate for the common contact(s) and all individual contacts, the common etch rate favoring accuracy of the common contact(s) over all individual contacts while still being within a desired etch window for all individual contacts.

In a second aspect, disclosed above is a non-planar semiconductor structure. The structure includes a semiconductor substrate of a first type (n-type or p-type). The structure further includes multiple raised semiconductor structures of a second type opposite the first type coupled to the substrate, isolation material surrounding a lower portion thereof, first well(s) of the second type directly under group(s) of at least two of the multiple raised structures, a guard ring of the first type around an edge of a top portion of the first well(s), a conformal layer of silicide over a top portion of the multiple raised structures above the isolation material, and contact(s) common to each group of raised structures above the conformal layer of silicide, at least one group of raised structures being part of a non-planar Schottky diode.

In one example, the semiconductor structure of the second aspect may further include, for example, other raised semiconductor structure(s) of the second type coupled to the substrate, other well(s) of the second type directly under the other raised structure(s), well isolation material separating an upper portion of each first well and the other well(s), the other well(s) each including a bottom extension under the isolation material in contact with a bottom portion of the first well(s), and a contact for each of the other raised structure(s). In one example, a depth of the well isolation material may be, for example, about a same depth as the guard ring.

In one example, the semiconductor structure with well isolation material may further include, for example, epitaxial material of the second type on the other raised semiconductor structure(s), the contact for each of the other raised structure (s) being situated on the epitaxial material.

In one example, the group(s) of raised structures of the semiconductor structure of the second aspect may include, for example, at least two groups of adjacent raised structures, the common contact(s) spanning the layer of silicide across each of the at least two groups of adjacent raised structures. Where the at least two groups of raised structures are present, at least one of the common contact(s) may span, for example, an area range from a first area of about 50 nm by about 50 nm, to a second area of about 5 microns by about 5 microns. In one example, the area range may be about 200 nm by about 200 nm.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a starting non-planar semiconductor structure, the structure comprising a bulk semiconductor substrate of a first type and a plurality of fins etched from the bulk semiconductor substrate with bottom portions thereof surrounded by isolation material over the substrate;
   creating at least one first well of a second type opposite the first type directly under one or more groups of at least two of the plurality of fins, creating the at least one first well also making the one or more groups of at least two fins the second type;
   removing a top portion of the isolation material, exposing a top portion of the plurality of fins;
   creating a conformal layer of silicide on the exposed portion of the plurality of fins; and
   creating one or more contacts common to each group of at least two fins over the conformal layer of silicide, wherein at least one group of at least two fins comprises a Schottky diode and at least one other group of at least two fins comprises a FinFET.

2. The method of claim 1, further comprising, between creating the at least one first well and removing the top portion of the isolation material, creating a guard ring at an edge of a top portion of the at least one first well.

3. The method of claim 2, wherein the plurality of fins of the non-planar semiconductor structure provided further comprise at least one other fin coupled to the substrate, the method further comprising:
   prior to removing the top portion of the isolation material, implanting impurities in and under the at least one other fin, the implant coming into contact with one or more of the at least one first well at a bottom portion thereof below the guard ring;
   after the removing, creating a conformal layer of hard mask material over the exposed portion of the one or more groups of at least fins;
   after creating the conformal layer of hard mask material, creating epitaxial semiconductor material of the second type on a top portion of the at least one other fin;
   after creating the epitaxial material and prior to creating the conformal layer of silicide, removing the conformal layer of hard mask material; and
   creating a contact over the epitaxial semiconductor material for each of the at least one other fin.

4. The method of claim 3, wherein creating the conformal layer of hard mask material comprises:
   creating a blanket conformal layer of hard mask material over the exposed portion of the one or more groups of at least two fins and the at least one other fin; and
   removing the blanket conformal layer of hard mask material over the at least one other fin.

5. The method of claim 3, further comprising implanting the epitaxial material with additional impurities of the second type.

6. The method of claim 3, further comprising, prior to creating the epitaxial material, recessing a top surface of the at least one other fin, wherein creating the epitaxial material comprises creating the epitaxial material on the recessed top surface.

7. The method of claim 3, wherein creating the epitaxial material comprises growing the epitaxial material.

8. The method of claim 1, wherein the plurality of fins of the non-planar semiconductor structure provided further comprise at least one other fin coupled to the substrate, the method further comprising:
  creating an individual contact over each of the at least one other fin, wherein the common contact has a larger area than each individual contact; and
  selecting a common etch rate for the one or more common contacts and all individual contacts, the common etch rate favoring accuracy of the one or more common contacts over all individual contacts while still being within a desired etch window for all individual contacts.

9. A non-planar semiconductor structure, comprising:
  a bulk semiconductor substrate of a first type, wherein the first type comprises one of n-type and p-type;
  a plurality of fins of a second type opposite the first type etched from the bulk semiconductor substrate, with isolation material surrounding a lower portion of the fins over the substrate;
  at least one first well of the second type directly under one or more groups of at least two of the plurality of fins;
  a guard ring of the first type around an edge of a top portion of each of the at least one first well;
  a conformal layer of silicide over a top portion of the plurality of fins above the isolation material; and
  one or more contacts common to each group of at least two fins above the conformal layer of silicide, wherein at least one group of at least two fins comprise a fin-based Schottky diode, and wherein at least one other group of at least two fins comprises a FinFET.

10. The semiconductor structure of claim 9, further comprising:
  at least one other fin of the plurality of fins of the second type etched from the bulk semiconductor substrate;
  at least one other well of the second type directly under the at least one other fin;
  well isolation material separating an upper portion of each of the at least one first well and the at least one other well, wherein the at least one other well comprises a bottom extension under the isolation material in contact with a bottom portion of the at least one first well; and
  a contact for each of the at least one other fin.

11. The semiconductor structure of claim 10, further comprising epitaxial material of the second type on the at least one other fin, wherein the contact for each of the at least one other fin is situated on the epitaxial material.

12. The semiconductor structure of claim 10, wherein a depth of the well isolation material is a same depth as the guard ring.

13. The semiconductor structure of claim 9, wherein the plurality of fins comprise at least two groups of adjacent fins, and wherein the one or more common contacts span the layer of silicide across each of the at least two groups of adjacent fins.

14. The semiconductor structure of claim 9, wherein at least one of the one or more common contacts spans an area range from a first area of 50 nm by 50 nm, to a second area of 5 microns by 5 microns.

15. The semiconductor structure of claim 14, wherein the area range comprises 200 nm by 200 nm.

* * * * *